United States Patent [19]
Lee

[11] 4,296,392
[45] Oct. 20, 1981

[54] SWITCHED CAPACITOR BILINEAR RESISTORS

[75] Inventor: Man S. Lee, Belmont, Calif.

[73] Assignee: GTE Automatic Electric Laboratories, Inc., Northlake, Ill.

[21] Appl. No.: 164,394

[22] Filed: Jun. 30, 1980

[51] Int. Cl.[3] .......................................... H03H 11/46
[52] U.S. Cl. ................................... 333/213; 330/107; 328/128; 333/216
[58] Field of Search ................ 330/109; 333/173, 213, 333/216; 328/128

[56] References Cited

U.S. PATENT DOCUMENTS 4,179,665  12/1979  Gregorian .......................... 330/107
4,210,872  7/1980  Gregorian ...................... 330/109 X Primary Examiner—Paul L. Gensler
Attorney, Agent, or Firm—Russell A. Cannon

[57] ABSTRACT

A two terminal circuit comprising a capacitive element (with a negative capacitance of value $-C/2$) connected between the terminals, and an integrated capacitor (with a positive capacitance C) having one and other sides thereof alternately or periodically connected to associated sides of the element and to ground for simulating a floating bilinear resistor having a resistance $R=T/C$ across the terminals which satifies the bilinear transformation $s=(2(z-1/T)z+1)$. This circuit is insensitive to both top and bottom plate parasitic capacitance effects assocated with the capacitance when one terminal is connected to a voltage source and the other to a virtual ground point on the input to an operational amplifier. In alternate embodiments, the circuit simulates a grounded bilinear resistor when only one of the terminals is connected to ground, and when one terminal and one side of the capacitor are grounded. In many applications the negative capacitive element may be absorbed by a positive capacitor of larger capacitance that is connected in parallel with it in a switched capacitor circuit.

24 Claims, 4 Drawing Figures

4,296,392

1

SWITCHED CAPACITOR BILINEAR RESISTORS

BACKGROUND OF INVENTION

This invention relates to switched capacitor circuits or networks and more particularly to switched capacitor circuit replacements for resistors.

There is currently much interest in the simulation of electrical components such as resistors and inductors using switched capacitor circuits so that filter networks can be implemented in fully integrated circuit form. Floating and/or grounded switched capacitor resistors are generally described in the references Sampled Analog Filtering Using Switched Capacitors as Resistor Equivalents by J. T. Caves et al, IEEE Journal of Solid State Circuits, Vol. 12, No. 6, pp 592-599, December 1977; MOS Sampled Data Recursive Filters Using Switched Capacitor Integrators by B. J. Hosticka et al, IEEE Journal of Solid State Circuits, Vol. 12, No. 6, pp 600-608, December 1977; Switched Capacitor Filter Design Using the Bilinear z-Transform by G. C. Temes et al, IEEE Transactions on Circuits and Systems, Vol. 25, No. 12, pp 1039-1044, December 1978; and Derivation of Switched Capacitor Filters from Active-RC Prototypes by G. C. Temes, Electronics Letters, Vol. 14, No. 12, pp 361-362, June, 1978. A number of the previously existing switched capacitor resistors are susceptible to top and/or bottom plate parasitic capacitance effects.

An object of this invention is the provision of novel switched capacitor circuits for simulating bilinear resistors.

Another object is the provision of a switched capacitor bilinear resistor simulation circuit that may be connected so as to be relatively insensitive to both top and bottom plate parasitic capacitance effects associated with an integrated capacitor thereof.

SUMMARY OF INVENTION

In accordance with this invention, an integratable switched capacitor circuit for simulating a bilinear resistor across a pair of nodes comprises first means for establishing a negative capacitance between first and second terminals thereof that are connected to associated nodes, and second means for alternately-periodically connecting opposite sides of an integrated capacitor in synchronism to associated nodes and to a ground reference potential. Connection of one node to the output of a voltage source and the other node to a virtual ground point on the input of an amplifier renders the circuit generally insensitive to both top and bottom plate parasitic capacitance effects associated with the integrated capacitor.

DESCRIPTION OF DRAWING

This invention will be more fully understood from the following detailed description of preferred embodiments thereof, together with the drawing in which.

DESCRIPTION OF PREFERRED EMBODIMENTS

Figure 1:
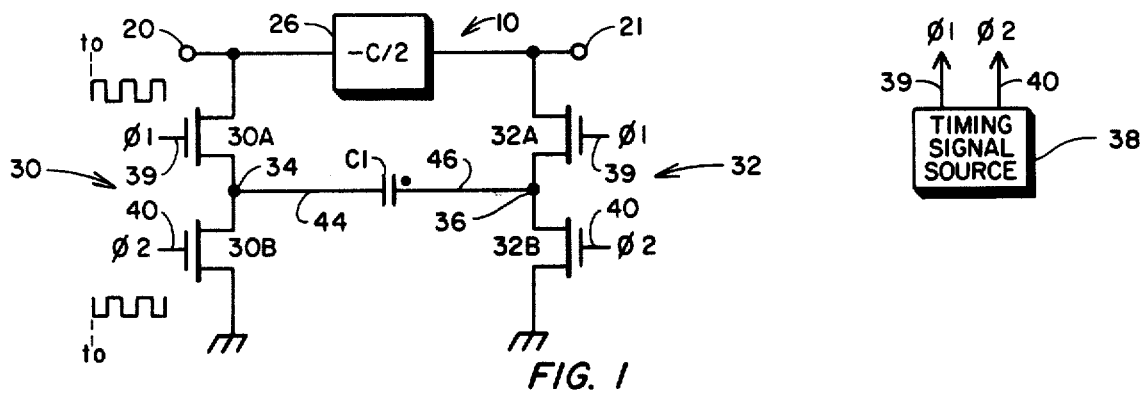
FIG. 1 is a schematic circuit diagram of the switched capacitor circuit 10 for simulating a floating bilinear resistor between the nodes or terminals 20 and 21.

Referring now to FIG. 1, a switched capacitor circuit or network 10 for simulating a floating bilinear resistor across a pair of terminals or nodes 20 and 21 thereof comprises a capacitor C1, capacitor means 26, switch means 30 and 32, and a source 38 of timing control signals. In a preferred embodiment of this invention that is implemented in fully integrated circuit form, the capacitor C1 is an integrated capacitor having a positive capacitance C. The dot on C1 indicates the top plate thereof. The capacitor means 26, however, is a two terminal circuit providing a negative capacitance $-C/2$ between the terminals thereof.

Figure 2:
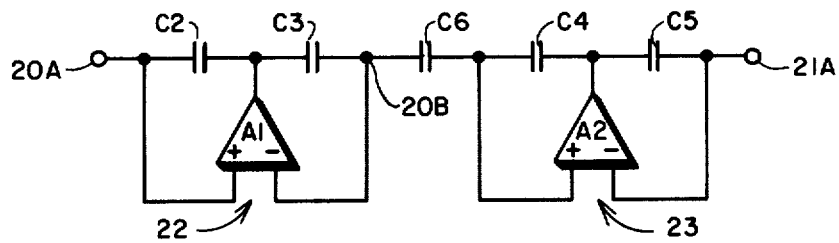
FIG. 2 is a schematic circuit diagram of a floating negative impedance converter circuit for simulating a negative capacitor across the nodes 20A and 21A thereof.

The floating capacitor means 26 in FIG. 1 may, by way of example, comprise a pair of negative impedance converters 22 and 23 that are connected as illustrated in FIG. 2. The structure and operation of negative impedance converters is well known. The circuit in FIG. 2 comprises a plurality of capacitors C2–C6 that are connected in series between nodes 20A and 21A, and a pair of differential input operational amplifiers A1 and A2. The integrated capacitors C2–C5 are fabricated as matched pairs having capacitances $C2=C3$ and $C4=C5$. Since each of the converters essentially comprises C6, the capacitance thereof is $C6=C/2$ so that the impedance between nodes 20A and 21A corresponds to that of a capacitance $-C/2$ therebetween. In practice, one node (e.g., node 20A) is normally connected to ground or the output terminal of a voltage source. It is therefore possible to remove the left half of the circuit (including A1, C2 and C3) and obtain the same overall operation since the nodes 20A and 20B are then at the same potential. It is not necessary for the capacitor means 26 to exist as a unique physical integrated circuit structure in many applications since it can often be absorbed by a positive capacitance of larger magnitude that is connected in parallel with it as is described more fully hereinafter and illustrated in FIGS. 3 and 4.

Each of the switch means 30 and 32 in FIG. 1 comprises a pair of integrated MOS FET transistors, for example, that are connected in series between an associated one of the terminals 20 and 21 and a ground reference potential. The intermediate terminals 34 and 36 of the switch means are connected to opposite sides of C1. The gate electrodes of the transistors of each pair thereof are driven by different ones of the two-phase non-overlapping digital timing control signals $\phi 1$ and $\phi 2$ that are produced by the signal source 38. These timing signals are 180° out of phase with respect to each other (as is indicated on the left side of FIG. 1) and preferably have a duty cycle of 50%. The switching frequency of the control signal is $f_s = 1/T$, where T is the period of a switching cycle. The switching frequency is greater than the Nyquist sampling rate.

Considering the operation of the circuit 10 in FIG. 1 irrespective of the characteristics of external circuits that may be connected to nodes 20 and 21 thereof, the switching transistors 30A and 32A conduct for connecting C1 across terminals 20 and 21 when the control signal $\phi 1$ is positive. This causes C1 to charge to an input voltage that is applied between the terminals 20 and 21. When the control signals $\phi 1$ and $\phi 2$ reverse polarity, transistors 30A and 32A are cutoff for disconnecting C1 from the nodes, and the other switching transistors conduct for connecting both sides of C1 to ground for discharging it. This operation of the switch means for alternately charging and discharging C1 causes the circuit 10 to simulate a floating resistor. Although the resistor simulated by this circuit 10 is susceptible to parasitic capacitance effects since both plates of the integrated capacitor C1 are periodically connected to floating nodes 20 and 21, it has the distinct advantage of being a truly floating resistor which, by taking account of the negative capacitor, is shown analytically hereinafter to be a bilinear resistor having a resistance R = T/C. If the circuit 10 is connected across the output of a network (not shown) having positive output capacitances Co then the means 26 may be absorbed into the network by merely reducing the output capacitances thereof to a value Co−C/2. The network and circuit 10 will still operate to perform these individual functions. The parasitic capacitance effects in the circuit 10 may be compensated by techniques described in published literature including Compensation For Parasitic Capacitances In Switched Capacitor Filters by G. C. Temes et al, Electronic Letters, vol. 15, no. 13, pp 377–379, June, 1979.

Figure 3:
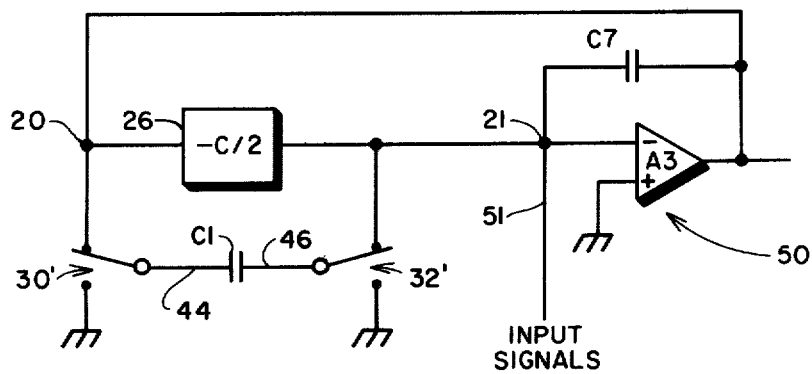
FIG. 3 is a schematic circuit diagram of an integrator circuit 50 having the switched capacitor circuit 10 connected therein so as to be insensitive to both top and bottom plate parasitic capacitance effects associated with the integrated capacitor C1, the switch means 30 and 32 being shown in schematic form.

In an application where the node 20 in FIG. 1 is connected to a voltage source such as the output terminal of an integrated operational amplifier, the circuit 10 simulates a bilinear source resistor. In this application, the resultant switched capacitor circuit is insensitive to bottom plate parasitic capacitance effects associated with the integrated capacitor C1 since the bottom plate line 44 is switched between ground and the output of a voltage source having a very low output impedance which is not affected by the loading of the parasitic capacitance. The top plate parasitic capacitance of C1 is very small such that its effect on the operation of the circuit 10 is negligible. In many active filter applications, the other terminal 21 in FIG. 1 is connected to a virtual ground point at an input terminal of an integrated operational amplifier as is illustrated in FIG. 3. This switches the other plate of C1 between ground potentials; therefore no charge is transferred by the associated parasitic capacitances and eliminating the effects thereof. In such a filter, the resultant network is insensitive to both top and bottom plate parasitic capacitance effects associated with the integrated capacitor C1 since both sides of C1 are now switched between ground potentials or between ground and the output of a voltage source.

Referring now to FIG. 3, the integrator circuit 50 here comprises a switched capacitor circuit 10 and a differential input operational amplifier A3. This integrator is a building block for multiple feedback filters. The non-inverting input terminal of A3 is connected to ground for impressing a virtual ground on the inverting input terminal thereof that is connected to node 21. Also, the output terminal of A3 is connected to the other node 20. This renders the circuit 50 insensitive to both bottom and top plate capacitance effects associated with the integrated capacitor C1 since one terminal 44 is switched between ground and the output of a voltage source A3 and the other terminal 46 is switched between ground potentials. An integrated capacitor C7 is connected across A3 for integrating input signals on line 51. The integrator circuit is also insensitive to both top and bottom plate parasitic capacitance effects associated with C7 since the two plates thereof are connected to a virtual ground and the output of the voltage source A3. The circuit 10 is operative in this integrator circuit for simulating a truly floating bilinear resistor across C7 that may be used to adjust the Q of the circuit.

In many applications, the capacitor means 26 is connected directly across a capacitor such as C7 in FIG. 3. When the absolute value of the capacitance provided by means 26 is less than the capacitance of C7, then the capacitance means can be absorbed into the integrated capacitor C7 by merely reducing the positive capacitance of the latter by the absolute value of the negative capacitance. By way of example, if the capacitance of C7 is normally 3C, then this capacitor C7 is caused to perform the function of both the negative capacitor means 26 and the capacitor C7 by merely reducing the capacitance of the latter to a value 2.5C. This feature of applicant's invention greatly simplfies the resultant circuit structure.

It can be shown analytically that the resistor simulated by the circuit 10 in FIG. 1 is a bilinear resistor by consideration of the charge flow there. The general representation of the differential charge-voltage relationship for a bilinear resistor is known to be $$\Delta Q(z) = (T/2R)(1 + z^{-1})V(z) \qquad (1)$$

where $Q(z)$ is charge in the discrete time domain, T is the sampling period, z is the operator in the z domain, and $V(z)$ is the discrete time voltage across the nodes 20 and 21.

The discrete time representations of differential charge in C1 and the negative capacitor means 26 are $$\Delta q1(nT) = Cv(nT) \qquad (2)$$

and $$\Delta q2(nT) = (-C/2)(v(nT) - v(nT - T))$$

so that the net differential charge is $$\Delta q(nT) = (Cv/2)(nT) + (Cv/2)(nT - T) \qquad (4)$$

Taking the z-transform of equation (4), the net differential charge-voltage relationship for the circuit 10 in the z-domain is determined to be $$\Delta Q(z) = \frac{C}{2} V(z) + \frac{C}{2} V(z)z^{-1} \qquad (5)$$
$$= \frac{C}{2}(1 + z^{-1})V(z)$$

Comparison of equation (1) and (5) reveals that the simulated bilinear resistor has a resistance R = T/C.

Figure 4:
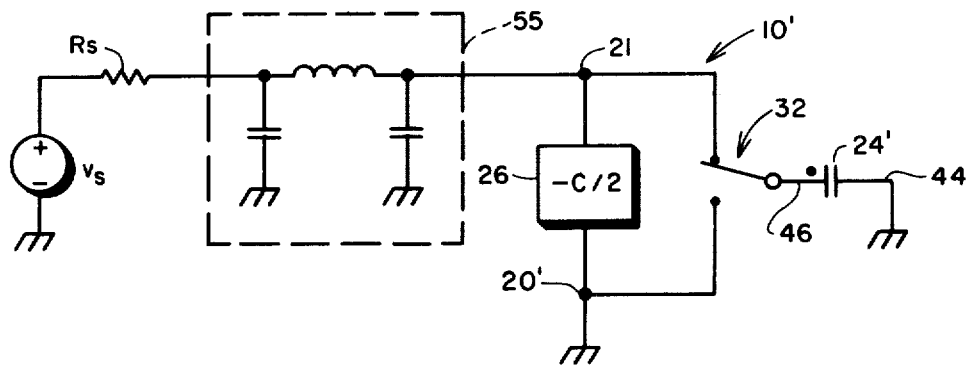
FIG. 4 is a schematic circuit diagram of an alternate embodiment of this invention that is connected as a bilinear load resistor for an LC filter section 55.

Although this invention is described in relation to preferred embodiments thereof, variations and modifications will occur to those skilled in the art. By way of example, the absolute values or ratios of the capacitances of C1 and means 26 may be other than C and C/2. The resultant circuits still simulate floating resistors having different values of resistance although they may no longer be bilinear resistors. Also, the circuit may be implemented with other than MOS technology, with discrete components, and in other than integrated form, the switch means being mechanical relays or switches, for example. Further, the bilinear floating resistor simulation circuit 10 in FIG. 1 may be converted to a bilinear grounded resistor simulation circuit by grounding either terminal 20 or terminal 21. Alternatively, a simplified grounded bilinear resistor simulation circuit 10' is obtained by connecting both the node 20 and the bottom plate terminal 44 on the integrated capacitor C1 to ground as is illustrated in FIG. 4. The terminals 20' and 21 of this simulation circuit 10' are connected across the output of an LC filter section 55 which may be fully implemented in integrated circuit form with switched capacitor techniques that are available in the published literature. The output of the filter section may have a capacitance $+C_o$ that is to have a load impedance connected across it. This embodiment of the invention does not require a physical element 26 for providing a negative capacitance $-C/2$ since it is only necessary here to reduce the desired value of the output capacitance $+C_o$ for the filter by the value of the negative capacitance to obtain the desired operation for the simulation network 10' and the filter section 55. Also, the switched capacitor circuit 10 in FIG. 1 is a switched capacitor bilinear resistive voltage-controlled current source if terminal 20 is connected to a voltage source and terminal 21 is connected to a virtual ground point since it is responsive to an applied voltage from the voltage source for producing an output current corresponding to that for a bilinear resistor into the virtual ground node. Additionally, the network 10 in FIG. 1 simulates a negative bilinear resistor when the transistors 30A and 30B are driven by $\phi 2$ and $\phi 1$, respectively, so that the switch means 30 and 32 are driven 180° out-of-phase. The scope of this invention is therefore defined by the appended claims rather than the aforementioned detailed description of preferred embodiments thereof.

What is claimed is:

1. An integratable switched capacitor circuit for simulating a resistor comprising:

first and second nodes;

a capacitor having a pair of terminals;

first means for effectively establishing a negative capacitance between a pair of terminals thereof;

second means connecting associated ones of said terminals of said first means to said first and second nodes, respectively;

third means for periodically connecting one side of said capacitor to ground and to one of said nodes at a prescribed switching frequency so as to simulate a resistor across said nodes.

2. The circuit according to claim 1 wherein said third means comprises fourth means which is a switch means that is periodically operative in first and second non-overlapping switch states for periodically connecting one side of said capacitor to the first node and to a ground reference potential, and fifth means which is a switch means that is periodically operative in first and second non-overlapping switch states for periodically connecting the other side of said capacitor to said second node and to ground for causing the circuit to simulate a floating resistor across said nodes.

3. The circuit according to claim 2 wherein the capacitances of said capacitor and established by said first means are approximately C and $-C/2$, respectively, for simulating a floating bilinear resistor having a resistance $R=T/C$ between said nodes when the circuit is characterized by the bilinear transformation $s=(2/T)(z-1/z+1)$, where s is the Laplace operator, T is the period at which said capacitor is switched, and z is the operator in the z-domain.

4. The circuit according to claim 3 wherein said fourth and fifth means change operating states once every T seconds, $f=1/T$ is the switching frequency for said capacitor, and f is greater than the Nyquist rate.

5. The circuit according to claim 2 including sixth means for electrically connecting said second node to ground, the circuit now simulating a grounded resistor between said first node and the ground reference potential.

6. The circuit according to claim 5 wherein the capacitances of said capacitor and established by said first means are approximately C and $-C/2$, respectively, for simulating a grounded bilinear resistor having a resistance $R=T/C$ between said nodes when the circuit is characterized by the bilinear transformation $s=(2/T)(z-1/z+1)$ where s is the Laplacian operator, T is the period at which said capacitor is switched, and z is the operator in the z-domain.

7. The circuit according to claim 1 including fourth means electrically connecting said second node and the other side of said capacitor to ground reference potential, said third means being a switch means that is periodically operative in first and second states for periodically electrically connecting the one side of said capacitor to said first node and to the ground reference potential, the circuit now simulating a grounded resistor.

8. The circuit according to claim 7 wherein the capacitances of said capacitor and established by said first means are approximately C and $-C/2$, respectively, for simulating a grounded bilinear resistor having a resistance $R=T/C$ between said nodes when the circuit is characterized by the bilinear transformation $s=(2/T)(z-1/z+1)$ where s is the Laplacian operator, T is the period at which said capacitor is switched, and z is the operator in the z-domain.

9. The circuit according to claim 5 or 7 wherein said capacitor is an integrated capacitor and said other side thereof is the bottom plate thereof that is either electrically connected to or is switched between ground reference potentials.

10. The circuit according to claim 5 or 7 wherein said first means comprises a network designed to have a positive output capacitance $C_o$ for connection to a grounded load resistor, said network being connected to said nodes so that the output capacitance thereof is connected across said nodes and has a capacitance reduced in value from Co by a value C3 of the negative capacitance for establishing a net negative capacitance $-C3$ between said nodes.

11. The circuit according to claim 2 wherein said first means comprises a network designed to have a positive output capacitance Co for connection across a resistor, said network being connected to said nodes so that the output capacitance thereof is connected across said nodes and has a capacitance reduced in value from Co by a value C3 of the negative capacitance for effectively establishing a net negative capacitance $-C3$ between said nodes.

12. The circuit according to claim 2 wherein said capacitor is an integrated capacitor with its one side being the bottom plate thereof and said first node is connected to the output of an integrated voltage source means, the simulated resistor being a source resistor looking into said second node that is relatively insensitive to parasitic capacitance effects associated with said capacitor.

13. The circuit according to claim 12 wherein said second node is connected to an input terminal of active integrated amplifier means that is at a virtual ground potential, the circuit being relatively insensitive to both top and bottom plate parasitic capacitance effects associated with said integrated capacitor.

14. The circuit according to claim 13 wherein said voltage source means comprises said amplifier means that has its output terminal connected to said first node and its input terminal that is a virtual ground point connected to said second node, the circuit further comprising a second integrated capacitor electrically connected across said input and output terminals of said amplifier means for integrating signals applied to said input terminal and being relatively insensitive to both top and bottom plate parasitic capacitance effects associated with said first named and second capacitors.

15. The circuit according to claim 14 wherein the desired capacitances of said first named capacitor and said first means are C and $-C/2$, respectively, and the desired capacitance Co of said second capacitor is greater than C/2, said first means comprising said second capacitor which has a net positive capacitance of $C0-C/2$.

16. The circuit according to claim 3 having said first and second nodes adapted for connection to the output of a voltage source and input terminal of an amplifier that is a virtual ground point for operating as a bilinear resistive voltage controlled current source.

17. An integratable switched capacitor circuit for simulating a load resistor for an electrical network, said circuit comprising:
first and second nodes electrically connected to associated output terminals of the network;
a capacitor having a pair of terminals,
first means electrically connecting said first node to a ground reference potential,
second means, which may be part of said electrical network, for establishing a negative capacitance between said nodes,
third means for periodically connecting said capacitor to ground and to at least one of said nodes at a prescribed switching rate so as to simulate a grounded resistor between said nodes.

18. The circuit according to claim 17 wherein said third means comprises fourth means connecting one side of said capacitor to ground, and fifth means which is a switch means that is periodically operative in first and second non-overlapping switch states for periodically connecting the other side of said capacitor to said second node and to ground.

19. The circuit according to claim 17 wherein said third means comprises:
fourth means which is a switch means that is periodically operative in first and second non-overlapping switch states for periodically connecting one side of said capacitor to said first node and to ground, respectively, and
fifth means which is a switch means that is periodically operative in first and second non-overlapping switch states for periodically connecting the other side of said capacitor to said second node and ground, respectively, the operation of said pair of switch means and associated switch states being synchronized.

20. The circuit according to claim 18 or 19 wherein the capacitance of said capacitor and the negative capacitance of said second means are approximately C and $-C/2$ for simulating a bilinear resistor having a resistance $R=T/C$ across said nodes when the circuit is characterized by the bilinear transformation $s=(2/T)(z-1/z+1)$ where s is the Laplace operator, T is the period at which the capacitor is switched, and z is the operator in the z-domain.

21. The circuit according to claim 18 or 19 wherein the capacitance of said capacitor and the negative capacitance of said second means are approximately C and $-C/2$ for simulating a bilinear resistor having a resistance $R=T/C$ across said nodes when the circuit is characterized by the bilinear transformation $s=(2/T)(z-1/z+1)$ where s is the Laplace operator, T is the period at which the capacitor is switched, and z is the operator in the z-domain, and said capacitor is an integrated capacitor having the bottom plate thereof either electrically connected to ground or switched between ground reference potentials for simulating a load resistor which is relatively insensitive to parasitic capacitance effects.

22. The circuit according to claim 18 or 19 wherein the capacitance of said capacitor and the negative capacitance of said second means are approximately C and $-C/2$ for simulating a bilinear resistor having a resistance $R=T/C$ across said nodes when the circuit is characterized by the bilinear transformation $s=(2/T)(z-1/z+1)$ where s is the Laplace operator, T is the period at which the capacitor is switched, z is the operator in the z-domain, and the network is designed to have a positive output capacitance Co across the output terminals thereof that are to be connected across a load resistor having one side thereof connected to ground, said second means comprising the network which has the positive output capacitance thereof reduced from the value Co by a prescribed amount C/2 to compensate for and effectively produce a net negative capacitance of value $-C/2$ across said nodes in the circuit.

23. The circuit according to claim 1 wherein said third means comprises fourth means which is a switch means that is periodically operative in first and second non-overlapping switch states for periodically connecting the one side of said capacitor to the first node and to a ground reference potential, and fifth means which is a switch means operating in synchronism with said other switch means and that is periodically operative in first and second non-overlapping switch states for periodically connecting the other side of said capacitor to said second node and to ground for causing the circuit to simulate a floating resistor across said nodes.

24. The circuit according to claim 23 wherein the capacitances of said capacitor and established by said first means are approximately C and $-C/2$, respectively, for simulating a floating negative bilinear resistance $R=T/C$ between said nodes when the circuit is characterized by the biliner transformation $s=(2/T)(z-1/z+1)$, where s is the Laplace operator, T is the period at which said capacitor is switched, and z is the operator in the z-domain.

* * * * *